(12) United States Patent
Ishii et al.

(10) Patent No.: US 7,616,066 B2
(45) Date of Patent: Nov. 10, 2009

(54) OSCILLATION DEVICE AND CONTROLLING METHOD THEREFOR

(75) Inventors: Satoru Ishii, Chiba (JP); Yasutaka Koike, Chiba (JP)

(73) Assignee: Futaba Corporation, Chiba (JP)

( * ) Notice: Subject to any disclaimer, the term of this patent is extended or adjusted under 35 U.S.C. 154(b) by 120 days.

(21) Appl. No.: 11/485,464

(22) Filed: Jul. 13, 2006

(65) Prior Publication Data

US 2007/0013449 A1 Jan. 18, 2007

(30) Foreign Application Priority Data

Jul. 13, 2005 (JP) ............................. 2005-204641

(51) Int. Cl.
 *H03L 7/08* (2006.01)
(52) U.S. Cl. .................. 331/16; 331/10; 331/14; 327/156
(58) Field of Classification Search ............ 331/16, 331/25, 14, 10, 17; 327/156
 See application file for complete search history.

(56) References Cited

U.S. PATENT DOCUMENTS

| 4,743,864 | A | * | 5/1988 | Nakagawa et al. | ........... | 331/1 A |
| 5,477,194 | A |   | 12/1995 | Nagakura |   |   |
| 5,656,975 | A | * | 8/1997 | Imura | ........................ | 331/11 |
| 6,643,347 | B2 | * | 11/2003 | Ohishi | ........................ | 375/376 |
| 6,731,146 | B1 | * | 5/2004 | Gallardo | ...................... | 327/158 |
| 6,771,133 | B2 | * | 8/2004 | Lautzenhiser | ................ | 331/17 |

FOREIGN PATENT DOCUMENTS

| JP | 58-066422 | 4/1983 |
| JP | 58-066427 | 4/1983 |
| JP | 58-101526 | 6/1983 |
| JP | 4-096515 | 3/1992 |
| JP | 7-030413 | 1/1995 |
| JP | 11-308104 | 11/1999 |
| JP | 2003-298415 | 10/2003 |

* cited by examiner

*Primary Examiner*—Robert Pascal
*Assistant Examiner*—Levi Gannon
(74) *Attorney, Agent, or Firm*—Bacon & Thomas, PLLC

(57) ABSTRACT

An oscillation device includes a reference oscillation unit for generating an oscillating signal of a specific frequency; a voltage-controlled oscillation unit for generating a output oscillation signal whose frequency is dependent on a control voltage; a phase comparing unit for detecting a phase difference based on the oscillating signal and the output oscillation signal; a digital value storage unit for storing therein a phase difference signal corresponding to the phase difference as a digital value; a sample holding unit for intermittently renewing and maintaining a hold signal in accordance with the digital value; and a control unit. The control unit controls the reference oscillation unit, the phase comparing unit and the digital value storage unit to be started or stopped, and also switches the control voltage to the phase difference signal or to the hold signal.

7 Claims, 8 Drawing Sheets

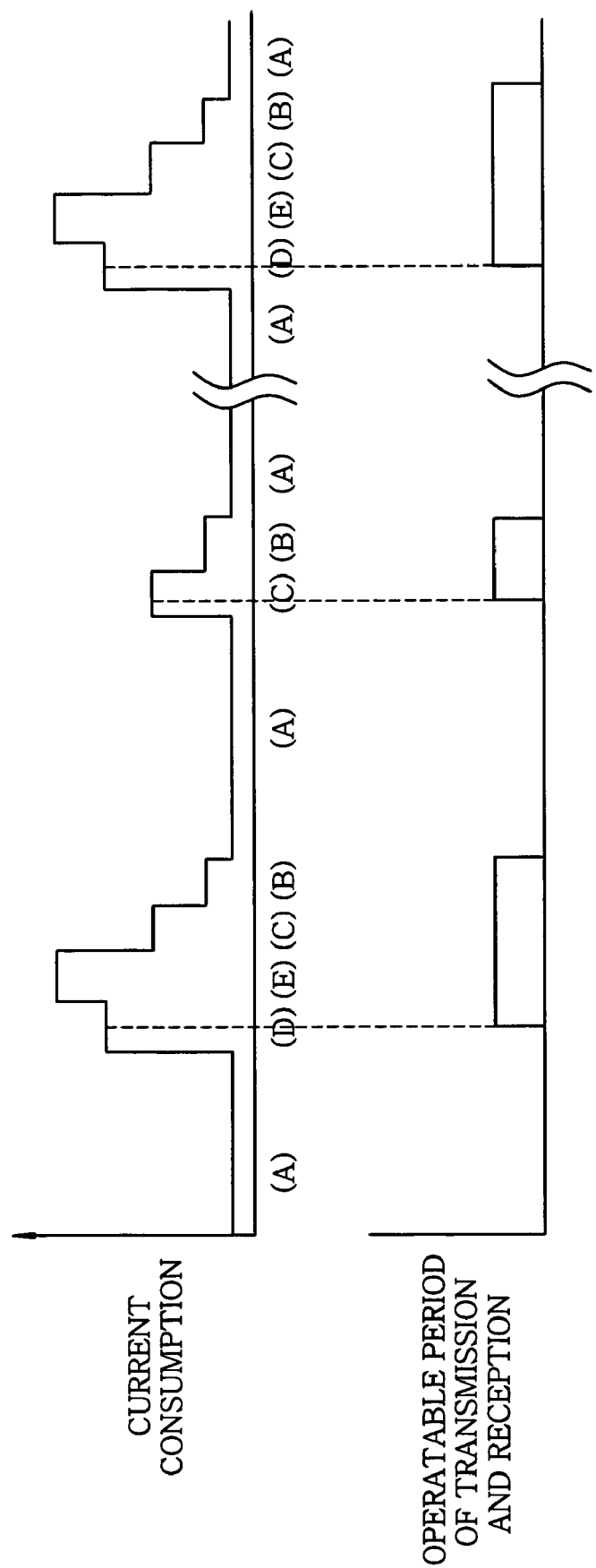

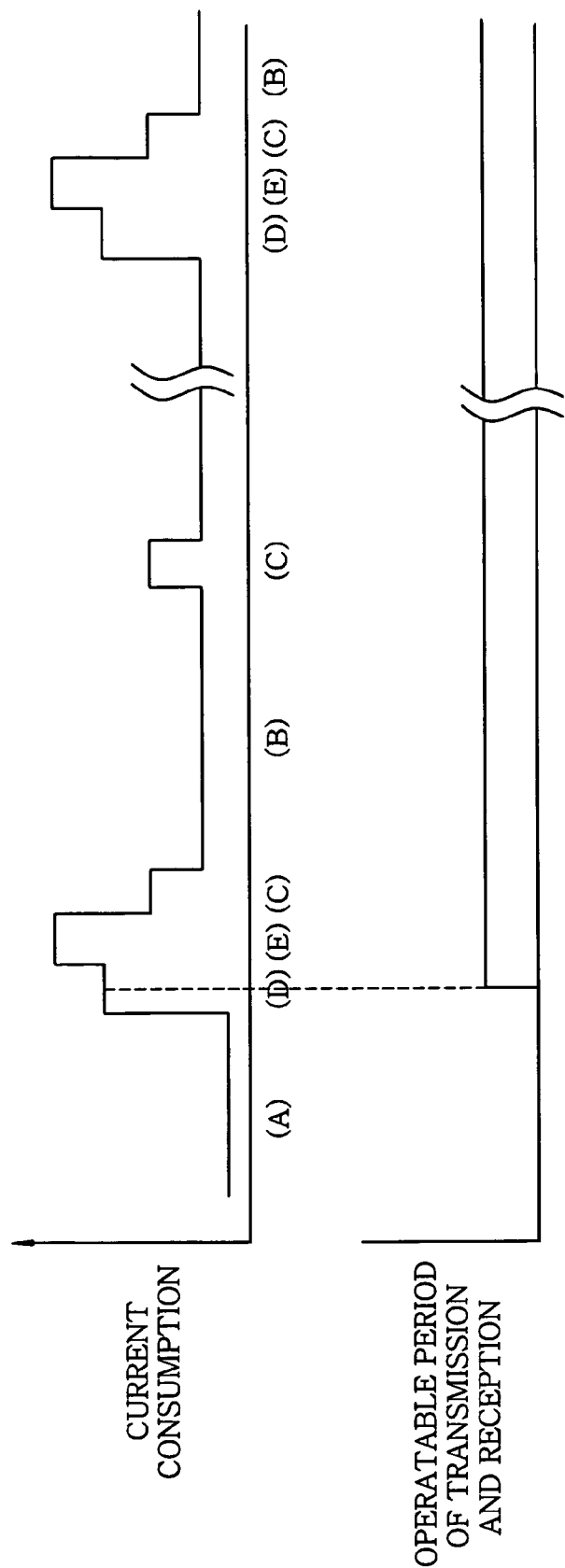

OSCILLATION DEVICE AND CONTROLLING METHOD THEREFOR

FIELD OF THE INVENTION

The present invention relates to an oscillation device and a controlling method therefor.

BACKGROUND OF THE INVENTION

Oscillation devices have been widely used for wireless devices for analog communications (transmitters and/or receivers), wireless devices for data communications (telemetry), or the like. Recently, PLL frequency synthesizers employing a phase locked loop (PLL) are widely used as oscillation devices in such wireless devices. Since, in the PLL frequency synthesizers, the oscillation frequency can be varied in a wide range with high frequency stability, the PLL frequency synthesizers are being widely used for household and industrial applications without being limited to the wireless devices.

FIG. 6 shows a conventional PLL frequency synthesizer 100. The PLL frequency synthesizer 100 includes a reference oscillator 101 made of, for example, a crystal oscillator; a 1/M frequency divider 102 made of a 1/M frequency dividing counter; a phase comparator 103 made of an exclusive-OR circuit; a loop filter 104 made of a lag filter and a lead filter; a voltage-controlled oscillator (VCO) 105; and a 1/N frequency divider 106 made of a programmable frequency dividing counter whose frequency dividing ratio N is variable.

The PLL frequency synthesizer 100 is configured by combining the aforementioned components as will be described hereinafter. An output end of the reference oscillator 101 is connected with an input end of the 1/M frequency divider 102; an output end of the 1/M frequency divider 102 is connected with one input end of the phase comparator 103; the other input end of the phase comparator 103 is connected with an output end of the 1/N frequency divider 106; an output end of the phase comparator 103 is connected with an input end of the loop filter 104; an output end of the loop filter 104 is connected with an input end of the voltage-controlled oscillator 105; and an output end of the voltage-controlled oscillator 105 is connected with an input end of the 1/N frequency divider 106.

With such configuration, the PLL frequency synthesizer serves as a feedback control system and operates as will be described later, thereby obtaining an output oscillation signal Sfo having a frequency of an integral multiple of that of a frequency dividing reference signal Sfm, wherein the integral multiple is equal to the frequency dividing ratio N. Herein, the frequency dividing reference signal Sfm has a frequency of 1/M times that of a reference oscillation signal Sfs.

First of all, the reference oscillation signal Sfs outputted from the reference oscillator 101 is frequency-converted into the frequency dividing reference signal Sfm of a lower oscillation frequency, wherein the oscillation frequency of the reference oscillation signal Sfs is divided by 1/M by the 1/M frequency dividing counter. By dividing the frequency of the reference oscillation signal Sfs by 1/M, even when a crystal oscillator, for example, is used as the reference oscillator 101, various frequencies of the output oscillation signal Sfo can be obtained in a discrete manner at a fine step while achieving a reduction in cost and size.

The phase comparator 103 compares a phase of the frequency dividing reference signal Sfm with that of the output frequency dividing signal Sfn. The phases are compared by measuring a time difference between a rising edge of a binarized frequency dividing reference signal Sfm and that of a binarized output oscillation signal Sfo, thereby outputting a phase error signal Spe corresponding to the time difference therebetween. Moreover, the loop filter 104 performs a phase compensation on the phase error signal Spe to output a phase compensation error signal Scpe. By performing the phase compensation, the feedback control system secures a gain margin and a phase margin sufficiently large enough to allow it to optimize its performance. Furthermore, in the voltage-controlled oscillator 105, output oscillation signal Sfo is changed in accordance with the phase compensation error signal Scpe to thereby allow the feedback control system to be operated such that the phase error signal Spe becomes close to zero.

As a result of such operation of the feedback control system, a frequency of the frequency dividing reference signal Sfm becomes perfectly identical to that of the output frequency dividing signal Sfn. Further, a frequency of the output oscillation signal Sfo is identified by multiplying the frequency dividing reference signal Sfm by the frequency dividing ratio N of the 1/N frequency dividing counter.

The aforementioned PLL frequency synthesizer can serve as a variable frequency oscillation device for oscillating widely ranging frequencies of signals by using the feedback control system. Further, it is possible to obtain an oscillation signal having a frequency accuracy approximately equal to that of the reference oscillation signal Sfs, e.g., that of the oscillation signal of the crystal oscillator. Moreover, even when the PLL frequency synthesizer serves not as the variable frequency oscillation device but as a fixed frequency oscillation device, since the setting a frequency thereof is so easy, a desired oscillation frequency can be easily obtained without requiring an additional crystal oscillator for every desired frequency. Moreover, by making the device more general-purposed, the costs of the oscillation device can be reduced.

However, the PLL frequency synthesizer consumes a large amount of power because of a large number of circuit devices. Especially, as an oscillation frequency increases, an increased current consumption in the reference oscillator causes a great loss, i.e., a switching loss generated at every clock period in digital circuits such as a frequency dividing counter and a phase comparator. Since the current consumption is large, it is difficult to operate for a long time wireless devices driven by a battery or a solar battery, e.g., a wireless telemetry device installed deep in a mountain, a wireless radio control device for wirelessly controlling a model plane or the like. Similar drawbacks are also found in case the PLL frequency synthesizer is made of an integrated circuit (IC).

SUMMARY OF THE INVENTION

It is, therefore, an object of the present invention to provide an oscillation device having a small power consumption while maintaining advantages of the PLL frequency synthesizer, and a method for controlling an oscillation frequency thereof.

In accordance with the present invention, there is provided an oscillation device including: a reference oscillation unit for generating an oscillating signal of a specific frequency; a voltage-controlled oscillation unit for generating an output oscillation signal whose frequency is dependent on a control voltage; a phase comparing unit for detecting a phase difference based on the oscillating signal and the output oscillation signal; a digital value storage unit for storing therein a phase difference signal corresponding to the phase difference as a digital value; a sample holding unit for intermittently renewing and maintaining a hold signal in accordance with the digital value; and a control unit for controlling the reference oscillation unit, the phase comparing unit and the digital value storage unit to be started or stopped, and also controlling to employ as the control voltage the phase difference signal or the hold signal, wherein the control unit performs the steps of employing as the control voltage the phase difference signal, operating the digital value storage unit after a specific period of time elapses or after the phase difference becomes within a specific range, employing as the control voltage the hold signal, and stopping the reference oscillation unit, the phase comparing unit and the digital value storage unit.

Thus, the oscillation device achieves the object of the invention by operating as follows. The reference oscillation unit generates an oscillating signal of a specific frequency. The voltage-controlled oscillation unit generates an output oscillation signal whose frequency is dependent on a control voltage. The phase comparing unit detects a phase difference based on the oscillating signal and the output oscillation signal. The digital value storage unit stores therein a phase difference signal corresponding to the phase difference as a digital value. The sample holding unit intermittently renews and maintains a hold signal in accordance with the digital value. The control unit controls the reference oscillation unit, the phase comparing unit and the digital value storage unit to be started or stopped, and also controls to employ as the control voltage either the phase difference signal or the hold signal. Further, the control unit controls to employ as the control voltage the phase difference signal, and operates the digital value storage unit after a specific period of time elapses or after the phase difference becomes within a specific range. Still further, the control unit controls to employ as the control voltage the hold signal, and stops the reference oscillation unit, the phase comparing unit and the digital value storage unit, thereby reducing the power consumption.

In accordance with the present invention, there is provided a method for controlling the oscillation device including a reference oscillation unit for generating an oscillating signal of a specific frequency, a voltage-controlled oscillation unit for generating an output oscillation signal whose frequency is dependent on a control voltage, and a phase comparing unit for detecting a phase difference based on the oscillating signal and the output oscillation signal, the method including the steps of: (a) operating the voltage-controlled oscillation unit until a specific time elapses or until the phase difference becomes within a specific range by using a phase difference signal corresponding to the phase signal as the control voltage; (b) storing the phase difference signal as a digital value; (c) intermittently renewing and maintaining a hold signal in accordance with the digital value; and (d) operating the voltage-controlled oscillation unit by using the hold signal as the control voltage, wherein the steps (c) and (d) are repeated alternately.

Thus, the oscillation device achieves the object of the invention by performing the following steps. In a first step, the voltage-controlled oscillation unit is operated until a specific time elapses or until the phase difference becomes to fall within a specific range by using a phase difference signal corresponding to the phase signal as the control voltage. In a second step, the phase difference signal is stored as a digital value. In a third step, a hold signal is intermittently renewed and maintained in accordance with the digital value. In a fourth step, the voltage-controlled oscillation unit is operated by using the hold signal as the control voltage. In a final step, the third and fourth steps are repeated alternately, so that the oscillation is continued at an approximately constant frequency.

BRIEF DESCRIPTION OF THE DRAWINGS

The above and other objects and features of the present invention will become apparent from the following description of preferred embodiments, given in conjunction with the accompanying drawings, in which:

FIG. 4 depicts a power consumption and an operatable period of a transmission/reception in the oscillation device;

FIG. 5 shows a power consumption and an operatable period of a transmission/reception in an oscillation device in accordance with another preferred embodiment of the present invention.

DETAILED DESCRIPTION OF THE PREFERRED EMBODIMENT

Hereinafter, preferred embodiments of the present invention will be described with reference to FIGS. 1 to 5.

Figure 1:
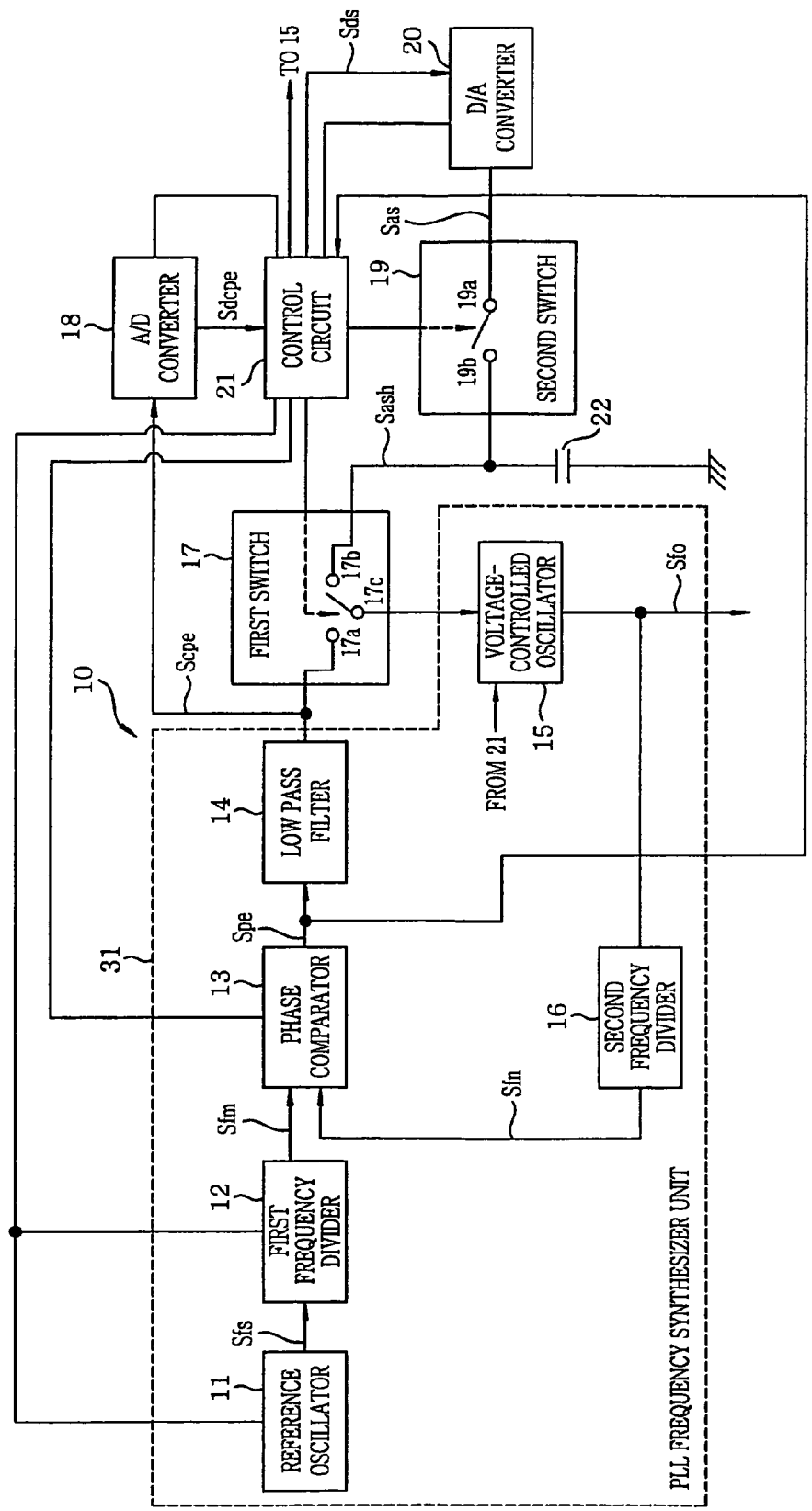
FIG. 1 is an overall block diagram of an oscillation device in accordance with a preferred embodiment of the present invention.
Figure 2A:
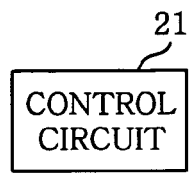
FIGS. 2A to 2E provide block diagrams illustrating components being operated on the basis of operation modes of the oscillation device.
Figure 2B:
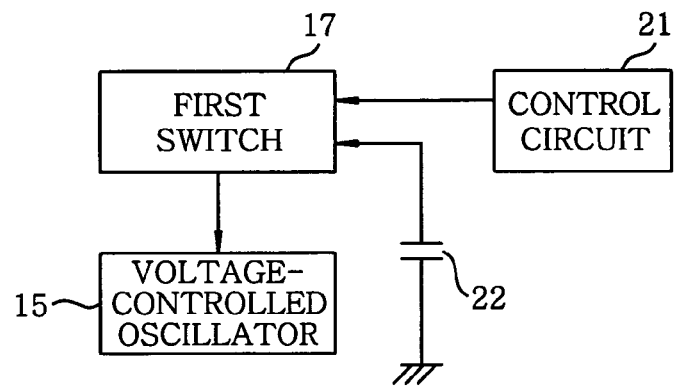
Figure 2C:
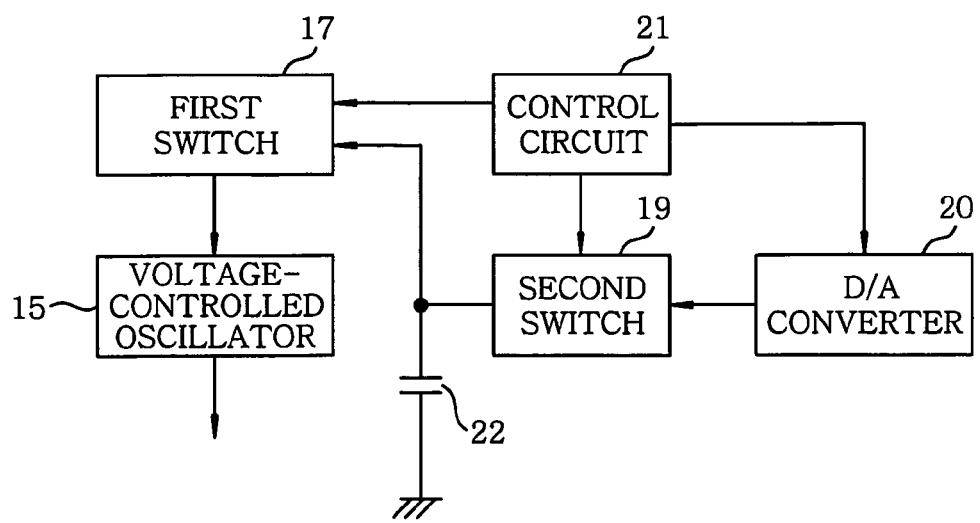
Figure 2D:
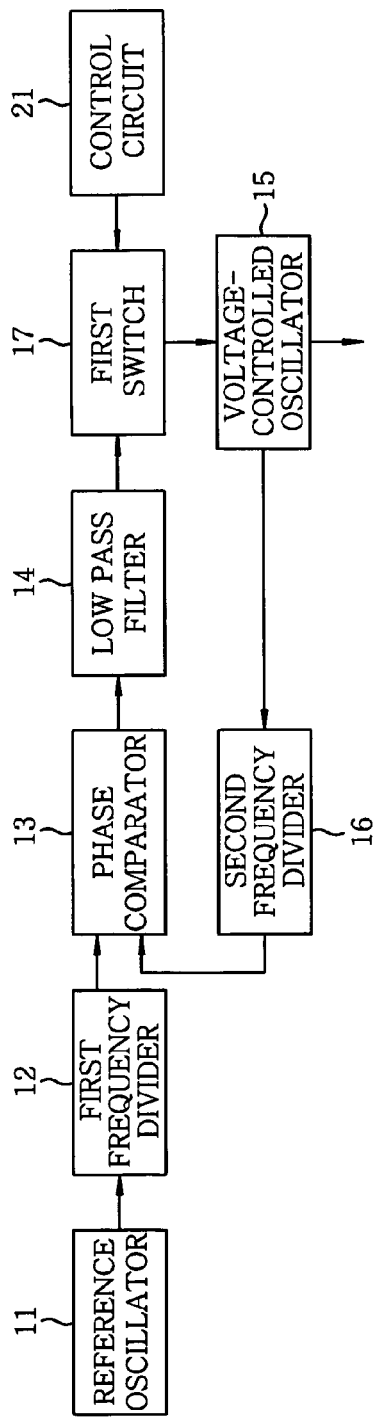
Figure 2E:
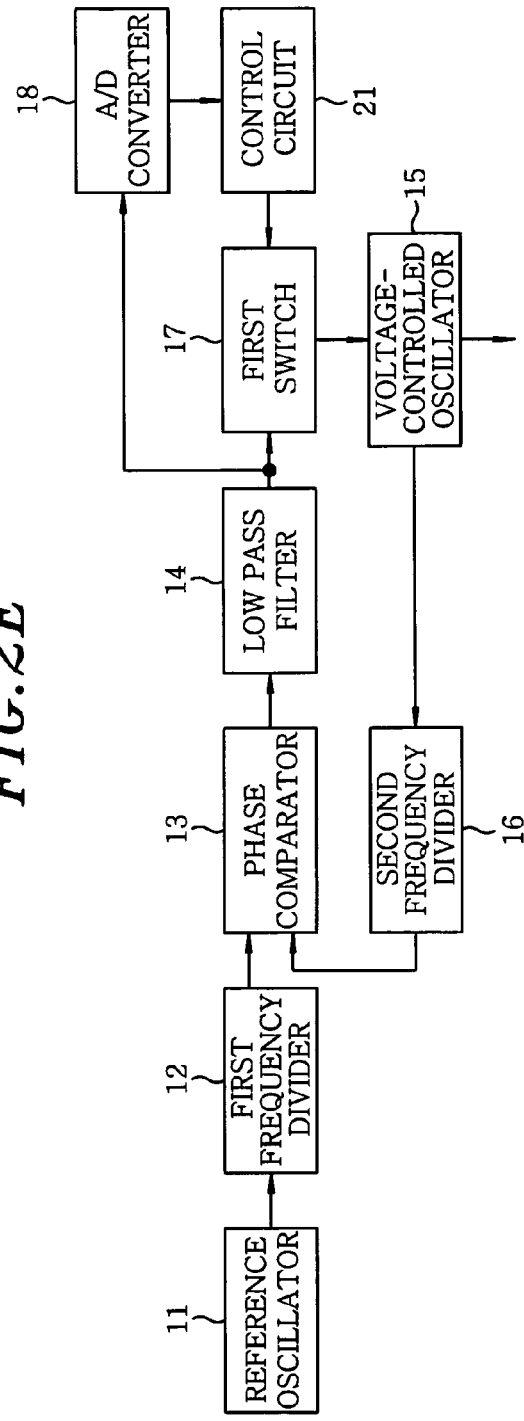
Figure 3A:
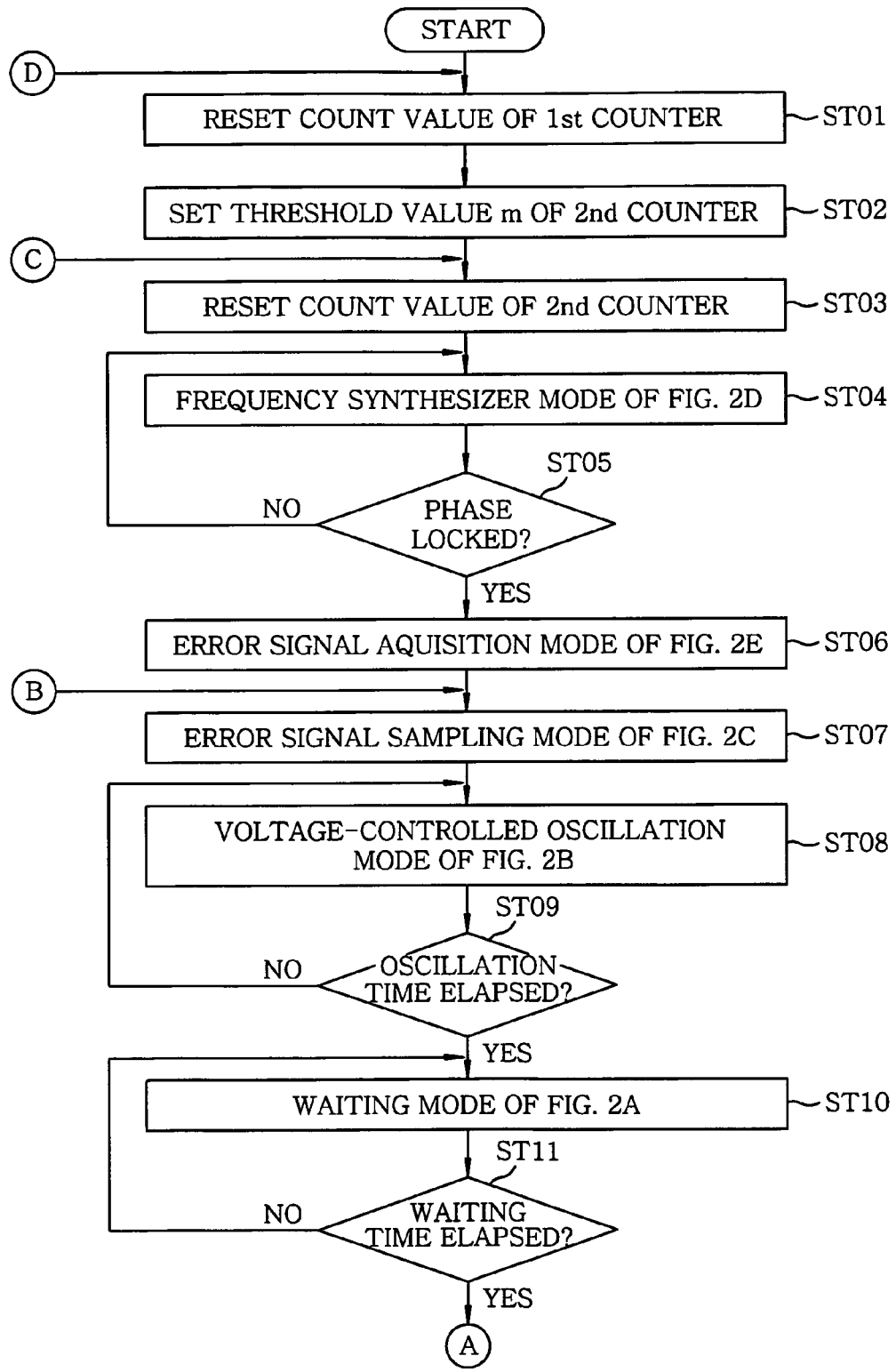
FIGS. 3A and 3B illustrate flowcharts describing an operation of the oscillation device.
Figure 3B:
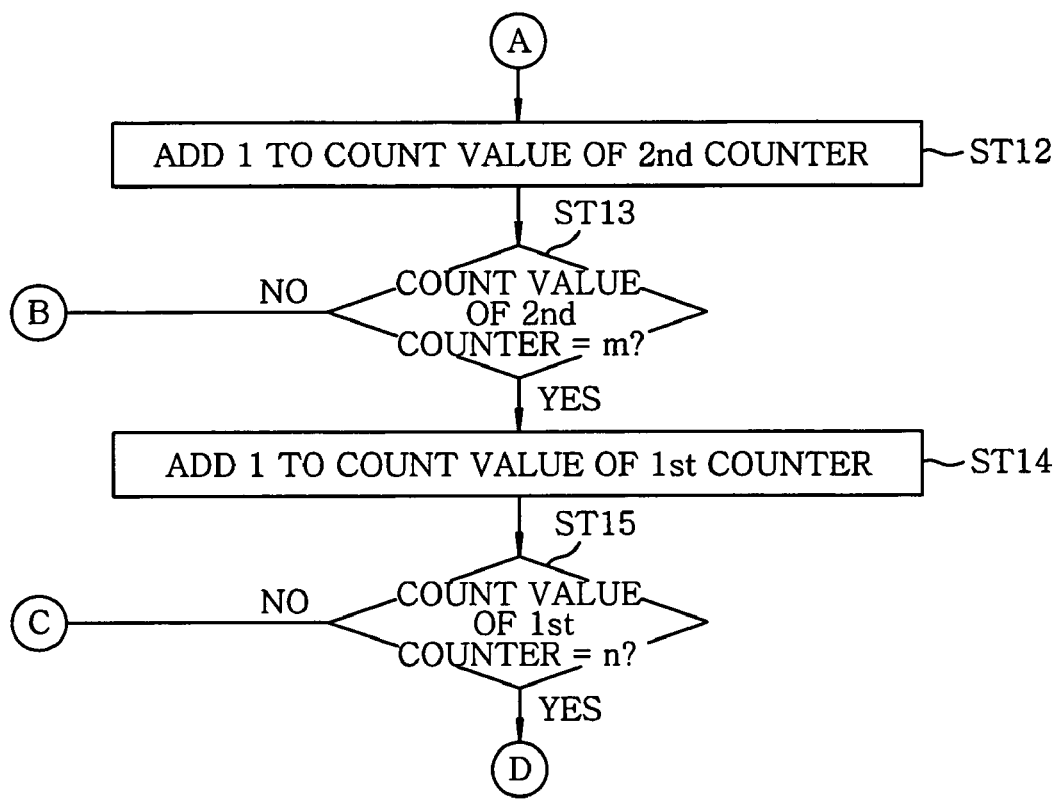

FIG. 1 is an overall block diagram of an oscillation device 10 in accordance with a preferred embodiment of the present invention; FIGS. 2A to 2E provide block diagrams illustrating components to which an electric power is supplied on the basis of operation modes of the oscillation device 10; FIGS. 3A and 3B illustrate flowcharts describing an operation of the oscillation device 10; FIG. 4 depicts a power consumption and operatable periods of a transmission/reception in the oscillation device 10; and FIG. 5 shows a power consumption and operatable periods of a transmission/reception in an oscillation device in accordance with another preferred embodiment of the present invention.

First of all, components of the oscillation device 10 in accordance with a preferred embodiment of the present invention will be described with reference to FIG. 1.

The oscillation device 10 includes a first switch 17, an A/D converter 18, a second switch 19, a D/A converter 20, a control circuit 21 and a capacitor 22 in addition to a PLL frequency synthesizer unit 31 enclosed by a dashed line of FIG. 1.

The PLL frequency synthesizer unit 31 has a reference oscillator 11, a first frequency divider 12, a phase comparator 13, a low pass filter 14, a voltage-controlled oscillator 15 and a second frequency divider 16. Such components have configurations similar to those of the conventional PLL frequency synthesizer 100 shown in FIG. 6.

Figure 6:
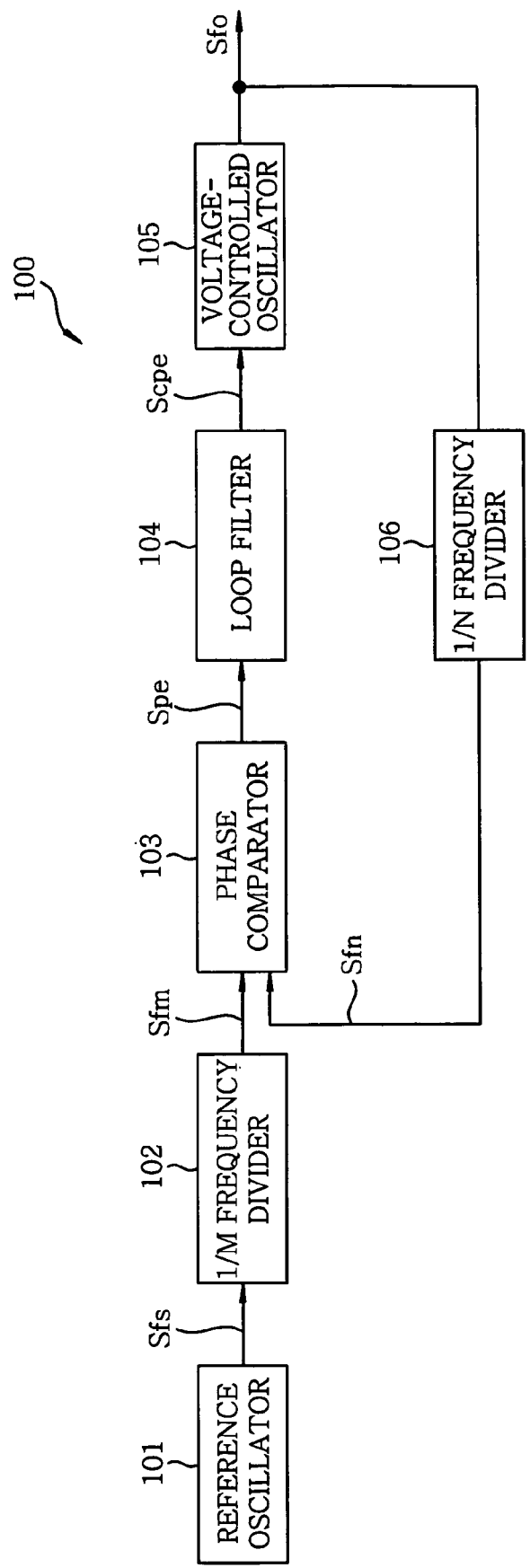
FIG. 6 represents an overall block diagram of a conventional oscillation device.

The following is a description of corresponding relationships between the components of FIG. 1 and those of FIG. 6. In other words, the reference oscillator 11 corresponds to the reference oscillator 101; the first frequency divider 12 corresponds to the 1/M frequency divider 102; the phase comparator 13 corresponds to the phase comparator 103; the low pass filter 14 corresponds to the loop filter 104; the voltage-controlled oscillator 15 corresponds to the voltage-controlled oscillator 105; and the second frequency divider 16 corresponds to the 1/N frequency divider 106.

In the present invention, the components corresponding to those of the prior art may have same configurations as those of the prior art without further restrictions. However, in this embodiment, the oscillation device 10 is configured to be described below, for example, in order to improve a performance thereof. By using the low pass filter 14 in place of the loop filter 104, even when a sample hold timing to be described later leads or lags slightly, a frequency deviation of the output oscillation signal Sfo can be prevented by allowing the phase compensation error signal Scpe to be a low-frequency signal. Moreover, in the oscillation device 10 of this embodiment, the oscillation frequency can be either fixed or varied. In case the oscillation frequency is fixed, a non-programmable counter may be used as the second frequency divider 16 without being limited to a programmable counter. Further, by using a surface acoustic wave (SAW) oscillator as the voltage-controlled oscillator 15 in this embodiment, a relationship between a control voltage and an oscillation frequency is prevented from being affected by a temperature change and a temporal variation, a variable range of the oscillation frequency is reduced, and a stability of the output oscillation signal Sfo is improved in case of controlling the voltage-controlled oscillator 15 by converting the control voltage into a hold voltage.

In this embodiment, the reference oscillator 11 and the first frequency divider 12 serve as reference oscillation units; the voltage-controlled oscillator 15 serves as a voltage-controlled oscillation unit; and the phase comparator 13 serves as a phase comparing unit.

Further, the reference oscillation signal Sfs, the frequency dividing reference signal Sfm, the output oscillation signal Sfo, the phase error signal Spe and the phase compensation error signal Scpe, which are outputted from the respective components of this embodiment, have approximately same characteristics as those of the prior art. Therefore, a description thereof will be omitted.

The oscillation device 10 of this embodiment is different from the PLL frequency synthesizer of the prior art in that it has the first switch 17, the A/D converter 18, the second switch 19, the D/A converter 20, the control circuit 21 and the capacitor 22. The following description will be based on such difference.

Above all, the components serving as features of this embodiment will be described in order. The control circuit 21 controls the entire oscillation device 10. By configuring the control circuit 21 by, e.g., a special-purpose integrated circuit (IC) for a random logic of complementary metal oxide semiconductor (CMOS) or a general-purpose micro processing unit (MPU), a power consumption is suppressed to be small compared with that of other components of the oscillation device 10.

In case the MPU serves as the control circuit 21, the MPU has a so-called "resume" function. In a waiting mode to be described later, such resume function is performed, so that an operational state of each component is stored in a nonvolatile backup memory. Moreover, regardless of whether the control circuit 21 is configured by a special-purpose IC or an MPU, the control circuit 21 controls some of the components in the oscillation device 10 to be stopped in accordance with the to-be-descried five operation modes including the aforementioned waiting mode.

Herein, the operation can be stopped by suspending a clock supply to a block related thereto. Further, since each of the blocks of this embodiment is configured based on a CMOS process, the electric power is not consumed when the clock supply to a block is stopped. In other words, when the clock supply is stopped, a switching loss becomes zero. Hence, substantially no power loss occurs.

In addition, the power consumption can also be reduced by stopping the power supply to the respective blocks shown in FIG. 1. In this case, MOSFETs for a small power consumption may be installed at power supply circuits of the respective components, allowing the control circuit 21 to control MOSFET gates.

Moreover, the control circuit 21 controls the first switch 17 to be converted to thereby determine whether to employ, as a control voltage of the voltage-controlled oscillator 15, a phase compensation error signal Scpe corresponding to a phase difference outputted from the phase comparator 13 or a hold signal Sash. Further, the control circuit 21 serves to convert the second switch 19 to obtain the hold signal Sash. In other words, in this embodiment, the control circuit 21 serves as a control unit.

The first switch 17 is a single-pole double-throw analog switch used for analog signals. Either a connection between contact points 17a and 17c or that between contact points 17b and 17c is selected by a digital H signal (high level signal) or L signal (low level signal) from the control circuit 21.

The A/D converter 18 converts analog signals into digital signals and, especially, converts an analog phase error signal Scpe outputted from the low pass filter 14 into a digital phase compensation signal Sdcpe so that it can be stored to be processed in the control circuit 21 for a long term. In this embodiment, the A/D converter 18 and a memory serve as digital value storage units, wherein the memory may be installed at, for example, the control circuit 21. Alternatively, the memory may be installed separately from the control circuit 21 and connected thereto.

The D/A converter 20 converts digital signals into analog signals and, especially, converts a digital sample signal Sds outputted from the memory installed at the control circuit 21 into an analog sample signal Sas. Further, a value of the digital sample signal Sds is equal to that of the digital phase compensation signal Sdcpe at a time of being stored in the memory in the control circuit 21 during an error signal acquisition mode to be described later.

The second switch 19 is a single-pole single-throw analog switch for passing analog signals. An "ON" (connection) and "OFF" (disconnection) of a connection pass are controlled by a digital H signal (high level signal) or L signal (low level signal) from the control circuit 21. That is, either a connection between contact points 19a and 19b (hereinafter, referred to as "ON") or a disconnection between the contact points 19a and 19b (hereinafter, referred to as "OFF") is selected by the control circuit 21.

More specifically, when the second switch 19 is ON, the capacitor 22 is connected with the D/A converter 20 and, also, the analog sample signal Sas is sampled so that its value becomes equal to a voltage of the capacitor 22. On the other hand, when the second switch 19 is OFF, the capacitor 22 and the D/A converter 20 are disconnected from each other and, also, an analog sample signal Sas obtained right before the disconnection is maintained as a hold signal Sash in the capacitor 22. In this embodiment, the D/A converter 20, the second switch 19 and the capacitor 22 serve as sample holders.

Ideally, a value of the hold signal Sash is always equal to that of the analog sample signal Sas. However, practically, the value of the hold signal Sash decreases by an electric discharge caused by a self-discharge of the capacitor 22, wherein the self-discharge occurs due to an internal equivalent parallel resistance of the capacitor 22. Besides, the value of the hold signal Sash increases or decreases due to an extremely small charging current or discharging current from the first switch 17 or the voltage-controlled oscillator 15. Herein, although an increased or a decreased value of the hold signal Sash can be restrained by increasing a value of the capacitor 22, it is disadvantageous in that an amount of electric charge for the capacitor 22 to be fully charged also increases.

As a result, the D/A converter 20 and the second switch 19 are scaled up in size and, also, a current consumption increases. To that end, by reducing a capacity of the capacitor 22 and repetitively recharging the capacitor 22, the value of the hold signal Sash is maintained at an approximately constant level and, thus, it is possible to output the output oscillation signal Sfo having a desired approximately constant frequency. A sequence thereof will be described with reference to the flowcharts of FIGS. 3A and 3B.

Before describing an operation of the oscillation device 10 of this embodiment, five operation modes in this embodiment will be described with reference to FIGS. 2A to 2E. FIGS. 2A to 2E provide block diagrams illustrating components being operated on the basis of the five operation modes of the oscillation device 10. To be specific, FIG. 2A shows a waiting mode as an example of a fifth step; FIG. 2B depicts a voltage-controlled oscillation mode as an example of a fourth step; FIG. 2C illustrates an error signal sampling mode as an example of a third step; FIG. 2D describes a frequency synthesizer mode as an example of a first step; and FIG. 2E presents an error signal acquisition mode as an example of a second step. A power consumption is smallest in the waiting mode of FIG. 2A and increases in the order of the voltage-controlled oscillation mode of FIG. 2B, the error signal sampling mode of FIG. 2C, the frequency synthesizer mode of FIG. 2D and the error signal acquisition mode of FIG. 2E.

In the waiting mode illustrated in the block diagram of FIG. 2A, the control circuit 21 exclusively operates, whereas other components, i.e., a transmitting unit (the reference oscillator 11 and the first frequency divider 12), a phase comparing unit (the phase comparator 13), a voltage-controlled oscillation unit (the voltage-controlled oscillator 15), a sample holder (the D/A converter 20, the second switch 19 and the capacitor 22) and a digital value storage unit (the A/D converter 18 and the memory of the control circuit 21), do not operate. Therefore, in the waiting mode, no output oscillation signal Sfo is outputted from the oscillation device 10.

In the voltage-controlled oscillation mode shown in the block diagram of FIG. 2B, the control circuit 21 instructs operations of the first switch 17 and the voltage-controlled oscillator 15. Meanwhile, operations of other components are stopped, wherein the other components include the transmitting unit (the reference oscillator 11 and the first frequency divider 12), the phase comparing unit (the phase comparator 13), the sample holder (the D/A converter 20, the second switch 19 and the condenser 22) and the digital value storage unit (the A/D converter 18 and the memory of the control circuit 21). Moreover, the control circuit 21 controls the contact points 17b and 17c of the first switch 17 to be connected to each other. Consequently, the voltage-controlled oscillator 15 oscillates by using the hold signal Sash held by the capacitor 22 as a control voltage, and the oscillation device 10 outputs an output oscillation signal Sfo of an approximately uniform frequency to the outside.

In the error signal sampling mode depicted in the block diagram of FIG. 2C, the control circuit 21 instructs operations of the first switch 17, the voltage-controlled oscillator 15, the second switch 19 and the D/A converter 20. Thus, operations of other components, i.e., the transmitting unit (the reference oscillator 11 and the first frequency divider 12), the phase comparing unit (the phase comparator 13) and the digital value storage unit (the A/D converter 18 and the memory of the control circuit 21), are stopped. Moreover, the control circuit 21 controls the contact points 17b and 17c of the first switch 17 to be connected to each other and turns on the second switch 19, thereby outputting a digital sample signal Sds held by the control circuit 21 to the D/A converter 20.

The D/A converter 20 outputs an analog sample signal Sas corresponding to the digital sample signal Sds stored in the control circuit 21, so that a voltage equal to that of the analog sample signal Sas is generated at both ends of the capacitor 22. Further, the voltage-controlled oscillator 15 is set to output an output oscillation signal Sfo of an approximately uniform frequency by using the analog sample signal Sas as a control voltage.

In the frequency synthesizer mode presented in the block diagram of FIG. 2D, the control circuit 21 instructs operations of the first switch 17 and the PLL frequency synthesizer unit 31. Thus, operations of other components, i.e., the digital value storage unit (the A/D converter 18 and the memory of the control circuit 21) and the sample holder (the D/A converter 20, the second switch 19 and the capacitor 22) are stopped. Moreover, the control circuit 21 controls the contact points 17a and 17c of the first switch 17 to be connected to each other. Accordingly, the oscillation device 10 serves as a general PLL frequency synthesizer, thereby outputting an output oscillation signal Sfo having a frequency accuracy equal to that of the reference oscillator 11.

In the error signal acquisition mode shown in the block diagram of FIG. 2E, the control circuit 21 instructs operations of the first switch 17, the A/D converter 18 and the PLL frequency synthesizer 31. Meanwhile, operations of the sample holder (the D/A converter 20, the second switch 19 and the capacitor 22) are stopped. Moreover, the control circuit 21 controls such that the contact points 17a and 17c of the first switch 17 are connected to each other. Further, a phase compensation error signal Scpe is converted into a digital phase compensation signal Sdcpe by the A/D converter 18 and, then, the digital phase compensation signal Sdcpe is stored in a specific memory installed in the control circuit 21 at every predetermined clock cycle. Meanwhile, the oscillation device 10 serves as a general PLL frequency synthesizer, thereby outputting an output oscillation signal Sfo having a frequency accuracy equal to that of the reference oscillator 11.

Hereinafter, operations in the five operation modes will be described with reference to the flowchart of FIG. 3. The flowchart of FIG. 3 depicts an outline of a sequence of processes (steps) performed by the control circuit 21.

First of all, once the processing is started, the control circuit 21 resets a value of a first counter to zero (step ST01). Herein, the first counter is configured to update a value stored in the memory installed in the control circuit 21. The first counter adds a count number until it reaches a threshold value n, wherein the threshold value n indicates the first counter's count number reached when a threshold value m of a second counter is updated to a new one.

Next, the control circuit 21 sets the threshold value m of the second counter (step ST02). The threshold value m determines how many times the oscillation device 10 will be operated intermittently in the voltage-controlled oscillation mode without correcting a frequency. In other words, the oscillation device 10 operates in the voltage-controlled oscillation mode until a value of the second counter reaches the threshold value m. Further, whenever the value of the second counter reaches the threshold value m, the oscillation device 10 operates in the frequency synthesizer mode, thereby correcting the frequency.

Thereafter, the control circuit 21 resets the value of the second counter to zero (step ST03). Herein, the second counter is formed of a memory installed at the control circuit 21, as same as the first counter. The second counter adds a count number until it reaches the threshold value m.

Then, the control circuit 21 sets the oscillation device 10 to the frequency synthesizer mode (step ST04). In other words, hardware components shown in FIG. 2D operate, and the oscillation device 10 serves as a PLL frequency synthesizer. The voltage-controlled oscillator 15 operates by using a phase compensation error signal Scpe from the low pass filter, i.e., a signal corresponding to the phase difference, as a control voltage.

Next, the control circuit 21 determines whether or not the oscillation device 10 has locked the phase (step ST05). If it is determined that the phase is not locked (indicated as "NO"), a process of this step is repeated. In other words, the fact that the phase is not locked indicates that the PLL frequency synthesizer does not output an output oscillation signal Sfo of a stable frequency. Thus, a process of a next step is delayed until the phase is locked. In this embodiment, the control circuit 21 determines whether the phase is locked or not by detecting whether or not the phase error signal Spe corresponding to a phase difference between the frequency dividing reference signal Sfm and the output frequency dividing signal Sfn falls within a specific range. Alternatively, the PLL frequency synthesizer unit 31 determines whether the phase is locked or not, and the determined result is transmitted to the control circuit 21. Still alternatively, the PLL frequency synthesizer determines that the phase is locked after a predetermined time elapses.

In the meantime, in case it is determined that the phase is locked (indicated by "Yes"), the control circuit 21 sets the oscillation device 10 to the error signal acquisition mode (step ST06). In the error signal acquisition mode, hardware components illustrated in FIG. 2E exclusively operate, thereby controlling each of the aforementioned components. That is, the A/D converter 18 converts a phase compensation error signal Scpe into a digital phase compensation signal Sdcpe and, then, a value of the digital phase compensation signal Sdcpe is inputted into a memory of the control circuit 21.

Thereafter, the control circuit 21 sets the oscillation device 10 to the error signal sampling mode (step ST07). In the error signal sampling mode, hardware components depicted in FIG. 2C exclusively operate, thereby controlling each of the aforementioned components. In other words, the digital phase compensation signal Sdcpe stored in the memory of the control circuit 21 right before the error signal sampling mode is set is outputted as a digital sample signal Sds to the D/A converter 20, so that an analog sample signal Sas is obtained. Thus, the capacitor 22 is charged with a voltage equal to that of the analog sample signal Sas supplied via the second switch 19 that is turned on. Accordingly, the voltage-controlled oscillator 15 outputs an output oscillation signal Sfo having a frequency approximately equal to that of the output oscillation signal Sfo outputted in the frequency synthesizer mode. Further, although it is not illustrated in the flowchart of FIG. 3, the process of the step ST07 is completed after a time sufficiently long enough to charge the capacitor 22 has elapsed, and then, a next step is executed.

Next, the control circuit 21 sets the oscillation device 10 to the voltage-controlled oscillation mode (step ST08). In the voltage-controlled oscillation mode, hardware components depicted in FIG. 2C exclusively operate, thereby controlling each of the aforementioned components. In other words, the voltage-controlled oscillator 15 constantly outputs an output oscillation signal Sfo having a frequency approximately equal to that of the output oscillation signal Sfo outputted in the frequency synthesizer mode by using a voltage charged to the capacitor 22, wherein the voltage is approximately equal to that of the hold signal Sash.

Then, the control circuit 21 checks whether or not a specific time for oscillation has elapsed (step ST09). In case it is determined that the specific time for oscillation has not elapsed (No), the process of the step ST08 is repeated. Thus, the voltage-controlled oscillator 15 continues to output an output oscillation signal Sfo having a frequency approximately equal to that of the output oscillation signal Sfo outputted in the frequency synthesizer mode in accordance with the voltage charged to the capacitor 22.

In case the oscillation device 10 operates as a part of a wireless device, a stable output oscillation signal Sfo needs to be constantly outputted during a sufficient time for completing data transmission. Further, in case the oscillation device 10 operates as a part of a receiver, a stable output oscillation signal Sfo needs to be constantly outputted during a sufficient time for completing data reception. The specific oscillation time indicates a time required for completing such data transmission and reception and managed by an oscillation timer installed at the control circuit 21.

In the meantime, in case it is determined that the specific oscillation time has elapsed (Yes), the control circuit 21 sets the oscillation device 10 to the waiting mode (step ST10). In the waiting mode, hardware components illustrated in FIG. 2A exclusively operate. In other words, while the control circuit 21 exclusively operates, the operations of other components are stopped, resulting in a minimized current consumption. Moreover, an output of the output oscillation signal Sfo is stopped.

Thereafter, the control circuit 21 checks whether or not a specific waiting time has elapsed (step ST11). Since the control circuit 21 continues to operate in the waiting mode as well, it is possible to check whether or not the waiting time has elapsed by using a waiting timer provided at the control circuit 21. In case it is determined that the specific waiting time has not elapsed (No), the process operation is returned to the step ST10, thereby maintaining the waiting mode.

In the meantime, in case it is determined that the specific waiting time has elapsed (Yes), the control circuit 21 adds a value of "1" to the value of the second counter (step ST12).

Then, the control circuit 21 checks whether or not the value of the second counter is same as the threshold value m (step ST13). In case it is determined that the value of the second counter is not same as the threshold value m (No), the oscillation device 10 is set to the error signal sampling mode again (step ST07). In other words, the D/A converter 20 converts the digital sample signal Sds into the analog sample signal Sas and, then, the capacitor 22 is charged with a voltage in accordance with the analog sample signal Sas again.

By repetitively recharging the capacitor 22, even in case of using a capacitor having a small capacitance, it is possible to maintain a value of the hold signal Sash held by the capacitor 22 at an approximately fixed level. Consequently, the control voltage can be maintained at an approximately fixed level and, thus, an oscillation signal Sfo of an approximately uniform frequency can be outputted.

In the meantime, in case it is determined that the value of the second counter becomes equal to the threshold value m, the control circuit 21 proceeds to a step ST14 and adds a value of "1" to the value of the first counter.

Thereafter, the control circuit 21 checks whether or not the value of the first counter is same as the threshold value n (step ST15). In case it is determined that the value of the first counter n is not same as the threshold value n, the value of the second counter is reset (step ST03), and the oscillation device 10 operates in the frequency synthesizer mode again. That is, by the operation in the frequency synthesizer mode, a frequency of the voltage-controlled oscillator 15 is corrected again, and, even when the frequency is deviated by an environmental change such as a temperature change or a temporal variation, it is possible to restore a desired frequency and then repeat the processes of the step ST04 and following steps.

On the other hand, in case it is determined that the value of the first counter becomes equal to the threshold value n (Yes), the control circuit 21 resets the value of the first counter (step ST0) and then performs the following processes by reading out a new value of the threshold value m of the second counter (step ST02). By reading out a new value of the threshold value m every time the value of the first counter reaches the threshold value n, it is possible to perform the control in accordance with external factors or hardware components. For example, the value of the threshold value m can be changed in a manner synchronous to a timer installed in the control circuit 21. That is, during a daytime when a temperature frequently changes, the oscillation device 10 is made to operate more frequently in the frequency synthesizer mode by reducing the value of the threshold value m. Accordingly, the oscillation frequency is frequently corrected, thereby enabling to achieve the stability of the output oscillation signal Sfo. On the other hand, during the night when a temperature is stable, the power consumption can be reduced by increasing the value of the threshold value m.

In the oscillation device 10 of the aforementioned embodiment, the control circuit 21 operates the oscillation device 10 in the waiting mode during the steps ST10 and ST11, thereby reducing the power consumption. However, in case of wireless devices for constantly performing a transmission and/or a reception, since a waiting time is needed before an output becomes stable, the waiting mode is rather undesirable due to an overhead involved therewith.

To that end, in accordance with another embodiment, after completing the step ST09 for checking whether the specific oscillation time has elapsed or not, the control circuit 21 can proceed to the step ST12 for adding a value of "1" to the value of the second counter without performing the processes of the steps ST10 and ST11. Thus, it is possible to constantly output an output oscillation signal Sfo having an approximately constant frequency.

An upper graph of FIG. 4 illustrates a power consumption change in the oscillation device 10 of this embodiment, and a lower graph of FIG. 4 shows operatable periods of a transmission/reception in the oscillation device 10 of this embodiment. Respective horizontal axes in FIG. 4 indicate time axes.

Notations (A) to (E) in the upper graph of FIG. 4 correspond to the block diagrams of FIGS. 2A to 2E showing the components being operated. Moreover, upwardly protruding portions in the lower graph represent operatable periods of the transmission/reception. During such periods, the output oscillation signal Sfo has sufficient frequency accuracy for the transmission/reception.

As depicted in FIG. 4, the frequency synthesizer mode (the period of the notation (D)) illustrated in the upper graph of FIG. 4 does not coincide with the operatable period of the transmission-reception operation in the lower graph of FIG. 4. In other words, right after the frequency synthesizer mode is set, the frequency of the output oscillation signal Sfo does not generally fall within a range adequate for performing the transmission/reception. Further, even when the waiting mode (the period of the notation (A)) has completed after the phase locked, the error signal sampling mode (the period of the notation (C)) indicated in the upper graph of FIG. 4 does not coincide with the operatable period of the transmission/reception in the lower graph of FIG. 4. That is, since the capacitor 22 is neglected without being sampled for a long period of time, a value of the analog sample signal is greatly different from that of the hold signal Sash stored in the capacitor 22. Consequently, in many cases, the frequency is not within the range adequate for performing the transmission/reception.

In other words, before the phase lock signal is detected after the frequency synthesizer mode is set, a frequency of the output oscillation signal Sfo gradually becomes closer to a specific oscillation frequency. Therefore, it becomes possible to perform the transmission/reception (transmission and/or reception) before the phase lock signal is generated. In a same manner, after the aforementioned mode is switched into the error signal sampling mode, the capacitor 22 is charged/discharged and the value of the hold signal Sash eventually becomes approximately equal to that of the analog sample signal Sas. However, even before the two values become equal, the transmission and/or the reception can be performed. But in both of the cases, a certain period of waiting time is needed before the transmission/reception can be performed. Since the waiting time changes in accordance with characteristics of a transceiver (transmitter and/or receiver), it is difficult to specify a precise amount of the waiting time.

Therefore, when the frequency synthesizer mode is set, it is preferable to perform the transmission/reception after it is determined in the step ST05 that the phase is locked. Further, when the error signal sampling mode is set, it is preferable to perform the transmission/reception after the voltage-controlled oscillation mode is set in the step ST08. More preferably, the oscillation device 10 can be used such that the control circuit 21 performs the transmission-reception by sending signals indicating that the transmission-reception can be performed to a transmitter and a receiver or to a transceiver (not shown) after completing the processes of the steps ST05 and ST08.

An upper graph of FIG. 5 illustrates a power consumption change in an oscillation device of the above-mentioned another embodiment, and a lower graph of FIG. 5 shows operatable periods of a transmission-reception operation of the oscillation device 10 of this embodiment. Respective horizontal axes shown in FIG. 5 indicate time axes.

Notations (B) to (E) in the upper graph of FIG. 5 correspond to the block diagrams of FIGS. 2B to 2E showing the components being operated. Moreover, upwardly protruding portions in the lower graph represent operatable periods of the transmission-reception operation. During such periods, the output oscillation signal Sfo has sufficient frequency accuracy for the transmission-reception operation. In this another embodiment, since the waiting mode is not needed, the frequency is regularly corrected after the initial phase lock. Moreover, the output oscillation signal Sfo is ensured to have the frequency accuracy adequate for performing the transmission-reception operation until a next frequency correction is performed. Accordingly, the transmission-reception operation can be constantly performed after the initial phase lock. The time for ensuring the sufficient frequency accuracy depends on hardware characteristics, for example, an accuracy of VCO, self-discharge characteristics of the capacitor 22 or the like.

In the oscillation device 10 of this embodiment, the reference oscillator 11, the first frequency divider 12, the phase comparator 13 and the second frequency divider 16 of the PLL frequency synthesizer unit 31 do not operate during a general operation state. Thus, a current consumption, i.e., a power consumption, can be greatly reduced compared with the conventional PLL frequency synthesizer. By intermittently operating the PLL frequency synthesizer unit 31 while reducing the power consumption and also operating the A/D converter 18, the control circuit 21, the D/A converter 20, the first switch 17, the second switch 19 and the capacitor 22, the frequency of the output oscillation signal Sfo can be properly corrected to a specific frequency. As a result, the output oscillation signal Sfo can have the accuracy sufficiently good enough to be used in a transceiver.

In addition, since a power supply to the voltage-controlled oscillator 15 is intermittently stopped, the power consumption is further reduced. Although the power consumption is reduced as described above, the control circuit 21 constantly operates with an extremely minute current. Accordingly, the output oscillation signal Sfo of a specific frequency can be outputted when it is needed for the transmission-reception. The oscillation device 10 of this embodiment is suitable for wireless devices for performing an intermittent operation, e.g., a wireless telemetry device.

In the oscillation device of this another embodiment, the transmission-reception can be constantly performed due to a constant power supply to the voltage-controlled oscillator 15. Since the oscillation device of another embodiment can constantly perform the transmission-reception operation, it is suitable for an oscillation unit of a radio control device, for example.

In accordance with the present invention, there can be provided an oscillation device and a method for controlling an oscillation frequency thereof in which the power consumption can be reduced.

While the invention has been shown and described with respect to the preferred embodiments, it will be understood by those skilled in the art that various changes and modification may be made without departing from the scope of the invention as defined in the following claims.

What is claimed is:

1. An oscillation device comprising:
   a reference oscillation unit for generating an oscillating signal of a specific frequency;
   a voltage-controlled oscillation unit for generating an output oscillation signal whose frequency is dependent on a control voltage;
   a phase comparing unit for detecting a phase difference based on the oscillating signal and the output oscillation signal;
   a digital value storage unit for storing therein a phase difference signal corresponding to the phase difference as a digital value;
   a sample holding unit for intermittently renewing and maintaining a hold signal in accordance with the digital value; and
   a control unit for controlling the reference oscillation unit, the phase comparing unit and the digital value storage unit to be started or stopped, and also controlling to employ as the control voltage the phase difference signal or the hold signal,
   wherein the control unit performs the step of employing as the control voltage the phase difference signal, the step of operating the digital value storage unit after a specific period of time elapses or after the phase difference becomes within a specific range, and the step of employing as the control voltage the hold signal and stopping the reference oscillation unit, the phase comparing unit and the digital value storage unit,
   wherein the voltage-controlled oscillation unit has a surface acoustic wave oscillator, the digital value storage unit has an A/D converter and a memory, and the sample holding unit has a D/A converter, a capacitor and an analog switch interposed between the D/A converter and the capacitor, and
   wherein the digital value stored in the digital value storage unit is obtained by filtering the phase difference signal by using a low pass filter.

2. The oscillation device of claim 1, wherein the control unit further performs the step of intermittently stopping the operations of the voltage-controlled oscillation unit and the sample holding unit after the step of stopping the reference oscillation unit, the phase comparing unit and the digital value storage unit 3. The oscillation device of claim 2, wherein the control unit performs the step employing as the control voltage the phase difference signal when the step of intermittently stopping the operations of the voltage-controlled oscillation unit and the sample holding unit is performed a determined number of times.

4. The oscillation device of claim 1, wherein when a specific oscillation time elapses, the control unit performs the step of stopping the operations of the voltage-controlled oscillation unit and the sample holding unit, after the step of stopping the reference oscillation unit, the phase comparing unit and the digital value storage unit, and
   wherein when a specific waiting time elapses after stopping the operations of the voltage-controlled oscillation unit and the sample holding unit, the control unit performs one of the steps of employing as the control voltage the phase difference signal, and employing as the control voltage the hold signal.

5. A method for controlling an oscillation device including a reference oscillation unit for generating an oscillating signal of a specific frequency, a voltage-controlled oscillation unit for generating an output oscillation signal whose frequency is dependent on a control voltage, and a phase comparing unit for detecting a phase difference based on the oscillating signal and the output oscillation signal, the method comprising the steps of:
   (a) operating the voltage-controlled oscillation unit until a specific time elapses or until the phase difference becomes within a specific range by using a phase difference signal corresponding to a phase signal as the control voltage;
   (b) storing the phase difference signal as a digital value;
   (c) intermittently renewing and maintaining a hold signal in accordance with the digital value; and
   (d) operating the voltage-controlled oscillation unit by using the hold signal as the control voltage,
   wherein the steps (c) and (d) are repeated alternately,
   wherein the reference oscillation unit and the phase comparing unit are stopped when the step (c) or (d) is performed, and
   wherein the step (c) is performed by a sample holding unit having a D/A converter, a capacitor and an analog switch interposed between the D/A converter and the capacitor.

6. The method of claim 5, further comprising, after the step (d), the step of:
   (e) stopping the operation of the voltage-controlled oscillation unit,
   wherein the steps (c) to (e) are repeated sequentially.

7. The method of claim 6, wherein the steps (a) and (b) is performed after the steps (c) to (e) are sequentially repeated a determined number of times.

* * * * *

UNITED STATES PATENT AND TRADEMARK OFFICE
CERTIFICATE OF CORRECTION

PATENT NO. : 7,616,066 B2
APPLICATION NO. : 11/485464
DATED : November 10, 2009
INVENTOR(S) : Ishii et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 206 days.

Signed and Sealed this

Nineteenth Day of October, 2010

David J. Kappos
*Director of the United States Patent and Trademark Office*